(12) United States Patent
Lee et al.

(10) Patent No.: US 6,423,640 B1
(45) Date of Patent: Jul. 23, 2002

(54) HEADLESS CMP PROCESS FOR OXIDE PLANARIZATION

(75) Inventors: Tze-Liang Lee; Fan-Keng Yang; Chen-Hwa Yu, all of Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 9 days.

(21) Appl. No.: 09/634,771

(22) Filed: Aug. 9, 2000

(51) Int. Cl.[7] .............................................. H01L 21/302
(52) U.S. Cl. ..................... 438/690; 438/691; 438/692
(58) Field of Search ................................. 438/690–693; 156/345; 451/41, 63, 158–160

(56) References Cited

U.S. PATENT DOCUMENTS

| | | | | | |
|---|---|---|---|---|---|
| 5,542,874 | A | * | 8/1996 | Chikaki | 451/158 |
| 5,860,851 | A | * | 1/1999 | Beppu et al. | 451/41 |
| 6,083,839 | A | * | 7/2000 | Wong | 438/693 |
| 6,099,394 | A | * | 8/2000 | James et al. | 451/72 |
| 6,143,662 | A | * | 11/2000 | Rhoades et al. | 438/690 |
| 6,143,663 | A | * | 11/2000 | Koutny, Jr. | 438/691 |
| 6,284,668 | B1 | * | 9/2001 | Imahashi | 438/716 |

* cited by examiner

Primary Examiner—Benjamin L. Utech
Assistant Examiner—Duy-Vu Deo
(74) Attorney, Agent, or Firm—Randy W. Tung

(57) ABSTRACT

A method for planarizing an oxide surface and removing dishing or erosion defect from a semiconductor wafer. An apparatus for carrying out the planarization process on a semiconductor wafer is further described. In the method, a wafer that has metal residues or dishing or erosion defect after a copper CMP process is first rotated at a rotational speed of at least 1000 RPM, while simultaneously a solvent/abrasive particles mixture is injected onto the rotating surface for a sufficient length of time until the metal residues, the dishing or erosion defect is removed. The rotational speed of the semiconductor wafer can be suitably controlled in a range between about 1000 RPM and about 10,000 RPM. For the removal of an oxide layer, a suitable solvent of diluted HF and a suitable abrasive particle such as aluminum oxide may be used.

16 Claims, 3 Drawing Sheets

HEADLESS CMP PROCESS FOR OXIDE PLANARIZATION

FIELD OF THE INVENTION

The present invention generally relates to a planarization process for a semiconductor material deposited on a semi-conducting substrate and more particularly, relates to a headless chemical mechanical polishing process for planarizing an oxide layer on a semi-conducting substrate without using a polishing disc and a polishing head and an apparatus for conducting the process.

BACKGROUND OF THE INVENTION

Apparatus for polishing thin, flat semi-conductor wafers is well-known in the art. Such apparatus normally includes a polishing head which carries a membrane for engaging and forcing a semiconductor wafer against a wetted polishing surface, such as a polishing pad. Either the pad, or the polishing head is rotated and oscillates the wafer over the polishing surface. The polishing head is forced downwardly onto the polishing surface by a pressurized air system or, similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head; a wafer unload station or, a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in de-ionized water.

A schematic of typical CMP apparatus is shown in FIGS. 1A and 1B. The apparatus for chemical mechanical polishing consists of a rotating wafer holder 14 that holds the wafer 10, the appropriate slurry 24, and a polishing pad 12 which is normally mounted to a rotating table 26 by adhesive means. The polishing pad 12 is applied to the wafer surface 22 at a specific pressure. The chemical mechanical polishing method can be used to provide a planar surface on dielectric layers, on deep and shallow trenches that are filled with polysilicon or oxide, and on various metal films. CMP polishing results from a combination of chemical and mechanical effects. A possible mechanism for the CMP process involves the formation of a chemically altered layer at the surface of the material being polished. The layer is mechanically removed from the underlying bulk material. An altered layer is then regrown on the surface while the process is repeated again. For instance, in metal polishing a metal oxide may be formed and removed repeatedly.

In the CMP process, large raised features and large recessed areas polish at about the same rate as the background area, or as a blanket film. The normal high polish rate of raised features and non-polishing of depressions is therefore not seen in these cases due to the flexibility of the polishing pad and to some extent, the polishing head. A planarization by just polishing is therefore difficult to achieve.

It has also been observed that clusters of closely spaced narrow features act as a large feature and is polished at a corresponding slower polishing rate. This further works against achieving global planarization. The various polishing defects that have been observed include non-uniformity, rounding, dishing and erosion. The dishing and erosion defects are shown in FIGS. 2A and 2B where the original surfaces before polishing are indicated by the dotted lines. To some extent, the severity of these polishing defects can be reduced by modifications made in the CMP process. For instance, the pad/slurry parameters may be adjusted by using a harder pad which polishes recessed areas more slowly than soft pads. Another approach that has been tried is to reduce the variation in pattern density. However, this is hard to implement since it involves changing the chip layout and circuit design.

In recent years, copper dual damascene process has become a popular method to form back-end-of-line interconnects. However, dishing and erosion defects are frequently encountered in the copper CMP process which is part of the damascene process in an undesirable topography of post-oxide deposition. The existence of topography recess causes the existence of metal residues which may either short the metal interconnects or impact the reliability of the device built.

Typical dishing and erosion defects occurring in a copper CMP process are shown in FIGS. 3A and 3B. As shown in FIG. 3B, metal residues 30 of either copper or TaN (a liner material) is left after the CMP process is completed which causes a short between the metal interconnects 28. The metal residues 30 is formed by the existence of a recess in the topography of the oxide (inter-metal-dielectric or IMD) layer 32. The exact location of the metal residues 30 determines the possible occurrence of a functional failure or a reliability problem. The topographic oxide recess is produced inherent from the dishing and/or erosion of copper CMP and the conformal oxide deposition of layer 32. Presently, the only possible solution is to improve the copper CMP recipe, and thus the copper CMP planarization process, to alleviate the dishing and/or the erosion problem. However, based on the inherent characteristics of the copper CMP process, it is difficult and costly to completely eliminate the dishing and erosion defect. it is therefore an object of the present invention to provide a method for oxide planarization that does not have the drawbacks or shortcomings of the conventional CMP method.

It is another object of the present invention to provide a method for oxide planarization by using a headless and padless spin etching process.

It is a further object of the present invention to provide a headless and padless chemical mechanical polishing process for oxide planarization by a spin etching.

It is another further object of the present invention to provide a padless and headless CMP process for oxide planarization by injecting a solvent/abrasive particles mixture onto an oxide surface.

It is still another object of the present invention to provide a headless and padless CMP process for oxide planarization by loading abrasive particles in a solvent for oxide and injecting the mixture onto the oxide surface.

It is yet another object of the present invention to provide a headless and padless CMP process for oxide planarization that is capable of substantially eliminating the dishing and erosion defects.

It is still another further object of the present invention to provide an apparatus for planarizing an outside surface on a semi-conductor wafer which includes a wafer platform capable of rotating at a speed of at least 1000 RPM and a solvent/abrasive particles mixture dispensing unit for injecting the mixture onto the oxide surface.

It is yet another further object of the present invention to provide an apparatus for planarizing an oxide surface on a semiconductor wafer that is capable of mixing and injecting an aluminum oxide particle loaded diluted HF solution onto an oxide surface on a wafer that is rotated at a speed of at least 1000 RPM.

SUMMARY OF THE INVENTION

In accordance with the present invention, a method for planarizing an oxide surface on a semiconductor wafer for removing metal residues and dishing/erosion defects and an apparatus for conducting the method are provided.

In a preferred embodiment, a method for planarizing an oxide surface for removing dishing or erosion defects can be carried out by the operating steps of providing a process chamber that is equipped with a rotatable wafer platform, positioning a wafer on the platform with a surface to be planarized exposed, the surface has dishing or erosion defect thereon, rotating the wafer at a rotational speed of at least 1000 RPM, and injecting a solvent/abrasive particles mixture onto the rotating oxide surface for a sufficient length of time until the dishing or erosion defect is removed.

The method for planarizing an oxide surface may further include the step of rotating the wafer at a rotational speed between about 1000 RPM and about 10,000 RPM. The method may further include the step of removing metal residues of copper or TaN from the surface of the wafer. The method may further include the step of mixing the solvent and abrasive particles together in a mixing head prior to injecting the solvent/abrasive particles mixture onto the rotating surface of the wafer. The abrasive particles may be selected from the group consisting of aluminum oxide, silicon carbide, silica sand and diamond-like carbon particles. The abrasive particles may have a particle size between about 0.01 $\mu$m and about 1 $\mu$m. The solvent used in the solvent/abrasive particles mixture may be a solvent for silicon oxide, or a solvent that has high selectivity toward silicon nitride. The solvent may be at least one member selected from the group consisting of HF, $H_3PO_4$, $HNO_3$, and $H_2SO_4$. The solvent may be a diluted HF and the abrasive particles may be aluminum oxide.

The present invention may be further directed to a method for removing metal residues and dishing defect from an oxide surface of a semiconductor wafer which can be carried out by the steps of providing a semiconductor wafer that has metal residues and dishing defect on a top surface, rotating the semiconductor wafer to a rotational speed of at least 1,000 RPM, mixing abrasive particles in a solvent forming a mixture, and injecting the mixture onto the rotating top surface of the semiconductor wafer until the metal residues and the dishing defect are substantially removed.

In the method for removing metal residues and dishing defect from an oxide surface of a semiconductor wafer, the top surface is an oxide surface and the metal residues is copper or TaN. The method may further include the step of rotating the semiconductor wafer to a rotational speed between about 1000 RPM and about 10,000 RPM. The method may further include the step of mixing abrasive particles of aluminum oxide in a solvent of diluted HF. The abrasive particles may also be selected from the group consisting of aluminum oxide, silicon carbide, silica sand and diamond-like-carbon particles. The solvent may be selected from the group consisting of HF, $H_3PO_4$, $HNO_3$, and $H_2SO_4$.

The present invention is further directed to an apparatus for planarizing an oxide surface on a semiconductor wafer which includes a process chamber that has a cavity therein, a wafer platform situated in the cavity for holding a wafer thereon and for rotating at a rotational speed of at least 1000 RPM, a solvent/abrasive particles mixture dispensing arm suspended over the wafer platform, and a solvent/abrasive particles mixture dispensing nozzle mounted on the dispensing arm for injecting the mixture onto an oxide surface on the wafer positioned on the wafer platform and rotated at a rotational speed of at least 1000 RPM.

In the apparatus for planarizing an oxide surface on a semiconductor wafer, the wafer platform may be rotatable at a speed between about 1000 RPM and about 10,000 RPM. The solvent/abrasive particles mixture may be dispensed at a temperature between about 10° C. and about 80° C. The solvent/abrasive particles mixture may be a mixture of aluminum oxide particles and diluted HF.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1A:
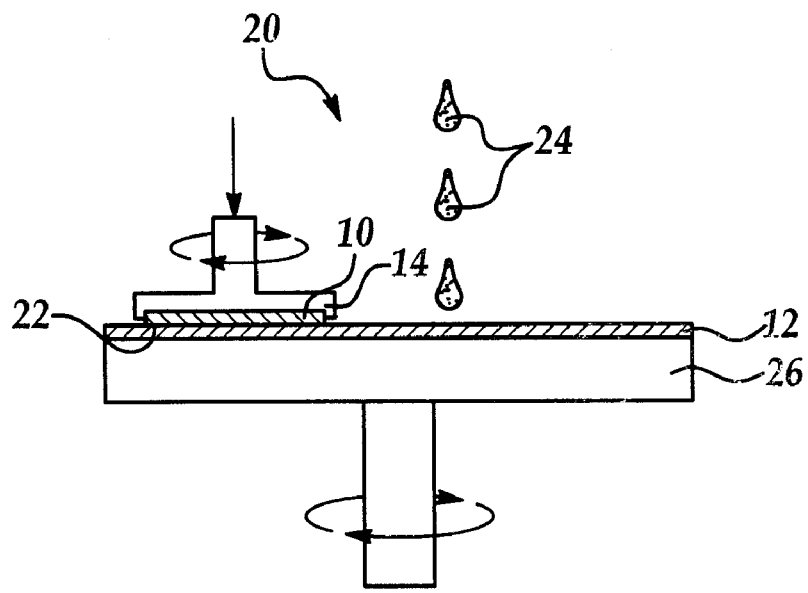
FIG. 1A is a cross-sectional view of a conventional rotary chemical mechanical polishing apparatus.
Figure 1B:
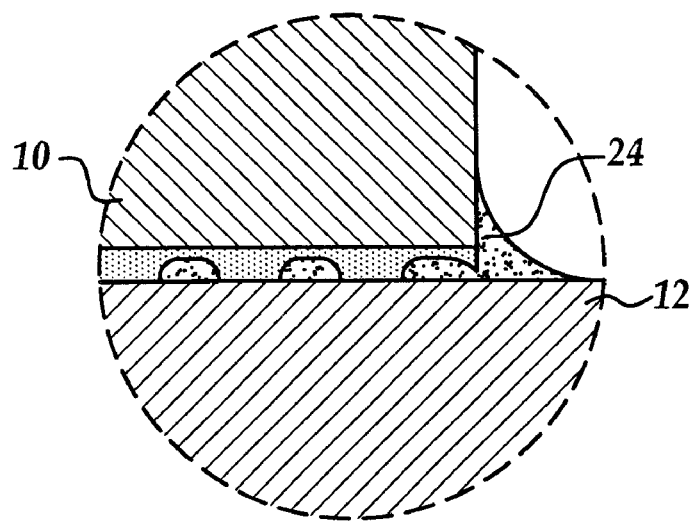
FIG. 1B is a partial, enlarged view illustrating an interaction between the wafer surface, the slurry and the polishing pad in a rotary CMP process.
Figure 2A:
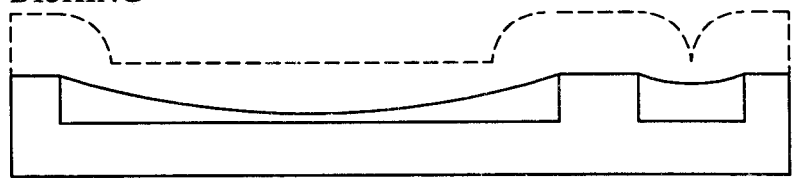
FIG. 2A is an enlarged, cross-sectional view of a semiconductor device illustrating a dishing defect after a CMP process.
Figure 2B:
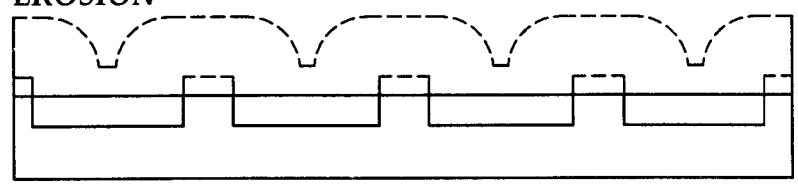
FIG. 2B is an enlarged, cross-sectional view of a semiconductor device illustrating an erosion defect.
Figure 3A:
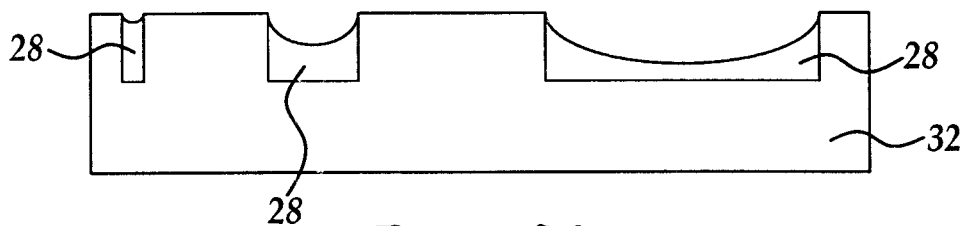
FIG. 3A is an enlarged, cross-sectional view of a semiconductor device illustrating the various sizes of a dishing defect after a CMP process.
Figure 3B:
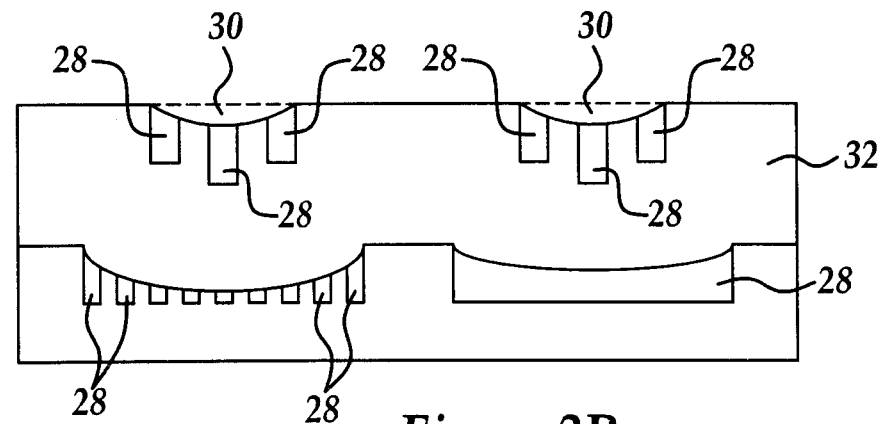
FIG. 3B is an enlarged, cross-sectional view of a semiconductor device having dual-layer interconnects illustrating a dishing defect and metal residues formed therein.

The present invention discloses a method for planarizing an oxide surface and for removing dishing or erosion defect on a semi-conductor wafer. The present invention is further directed to a method for removing metal residues and dishing/erosion defect from a top surface of a semiconductor wafer. The present invention is still further directed to an apparatus for planarizing an oxide surface on a semiconductor wafer.

In the method for planarizing an outside surface and reducing dishing or erosion defect, a semiconductor wafer having a top surface to be planarized is first rotated on a wafer platform to a speed of at least 1000 RPM, a solvent/abrasive particles mixture is then injected onto the rotating surface of the semiconductor wafer for a sufficient length of time until the dishing or erosion defect is removed. The method may further remove metal residues such as Cu and TaN and dishing defect from an oxide surface on a semiconductor wafer. The wafer may be rotated while bombarded by the solvent/abrasive particles mixture at a rotational speed between about 1000 RPM and about 10,000 RPM. The solvent and abrasive particles may be mixed together in a mixing head prior to injecting the mixture onto the rotating surface of the wafer. Suitable abrasive particles that can be used in the present invention novel method include aluminum oxide, silicon carbide, silica sand and diamond-like-carbon particles. The particles may have a particle size between about 0.01 $\mu$m and about 1 $\mu$m.

The solvent utilized in the solvent/abrasive particles mixture may be a solvent for silicon oxide, or a solvent that has high selectivity toward silicon nitride such that it does not attack the silicon nitride and only etches oxide. The solvent may be HF, $H_3PO_4$, $HNO_3$, and $H_2SO_4$ or mixtures thereof. A suitable solvent to be used is a diluted HF, i.e. a 49% HF/51% water mixture. A suitable abrasive particle to be used is aluminum oxide.

The apparatus for planarizing an oxide surface on a semiconductor wafer is constructed by a process chamber with a cavity therein, a wafer platform situated in the cavity that is capable of being rotated at a speed between about 1000 RPM and about 10,000 RPM, a solvent/abrasive particles mixture dispensing nozzle installed on a dispensing arm that is suspended over the wafer platform for injecting the solvent/abrasive particles mixture onto a semiconductor wafer such that metal residues on an oxide layer and dishing or erosion defect in the oxide layer can be substantially removed.

In the present invention novel method, the viscosity of the solvent/abrasive particles mixture can be suitably adjusted for each application such that a desirable removal rate can be achieved. The viscosity of the mixture can be adjusted by generally changing the composition of the mixture, i.e. or changing the abrasive particle content in the mixture. The present invention novel method is effected by both a chemical reaction between the solvent and the oxide surface and a mechanical reaction between the abrasive particles and the oxide surface. The present invention novel method, while applicable in various semiconductor processes, is particularly suited for preparing a surface for carrying out a copper dual damascene process for building a layer of via contacts and a layer of trench contacts.

Figure 4:
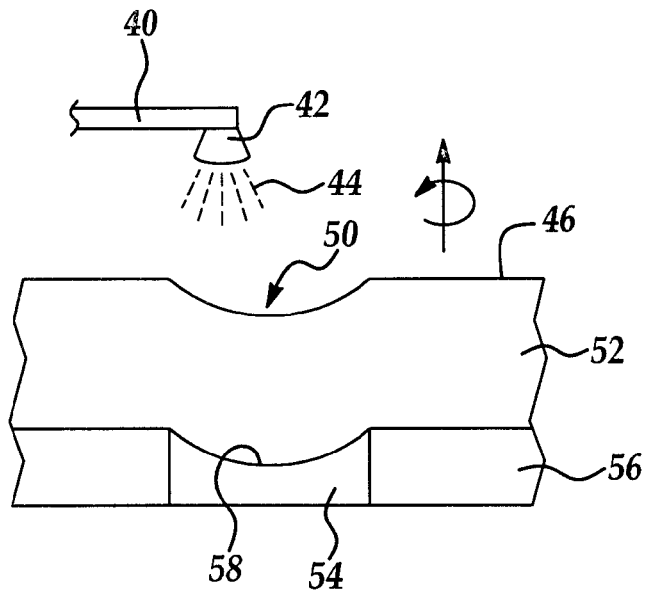
FIG. 4 is an illustration of a present invention planarization process for an oxide surface having a dishing defect.

In the present invention novel method, as shown in FIG. 4, a dispensing arm 40 equipped with a dispensing nozzle 42 is used for spraying, under a suitable pressure, a solvent/abrasive particles mixture 44 onto an oxide surface 46 that has a dishing defect 50. The top surface 46 of the oxide layer 52 is built on a metal trench 54 embedded in an insulating layer 56. The dishing defect 50 is caused by the convex surface 58 formed on the metal conductor 54.

Figure 5:
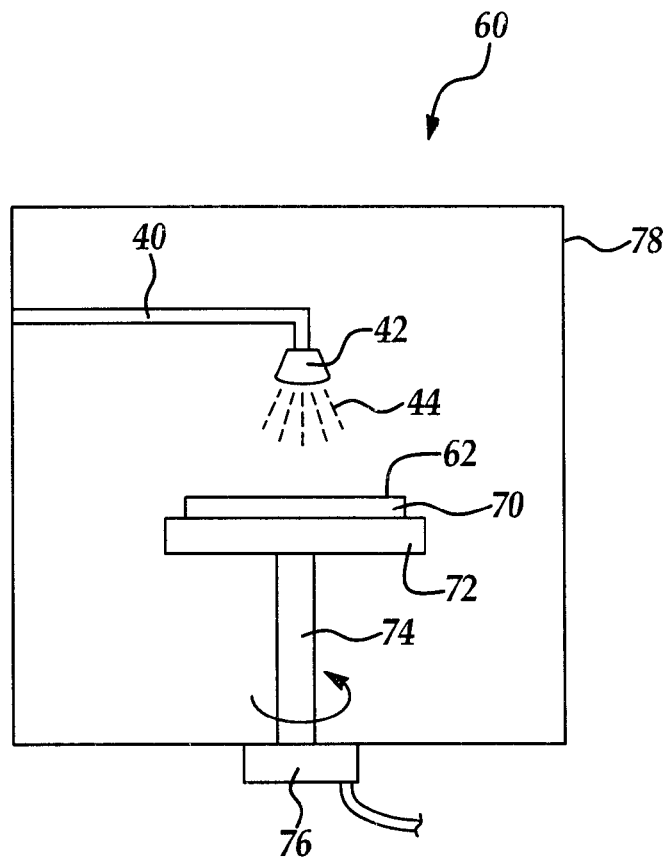
FIG. 5 is a cross-sectional view of a present invention apparatus for planarizing an oxide surface on a semiconductor wafer.

A cross-sectional view of the present invention novel apparatus 60 is shown in FIG. 5. The apparatus 60, in its simplified illustration, consists of a dispensing arm 40 and a dispensing nozzle 42 for dispensing a solvent/abrasive particles mixture 44 onto a top surface 62 of a semiconductor wafer 70. The semiconductor wafer 70 is positioned on a wafer pedestal 72 which is supported by shaft 74 for providing rotational motion. The shaft 74 is driven by motor 76 for providing a rotational speed of the wafer pedestal 72 in a range between about 1000 RPM and about 10,000 RPM, and preferably between about 3000 RPM and about 6000 RPM. The various components of the present invention novel apparatus 60 is contained in an enclosure 78 for containing the solvent/abrasive particles mixture that is injected onto the wafer surface.

In the present invention novel method, the top surface 62 of the semiconductor wafer 70 is etched while the wafer is spun at the suitable rotational speed. The etching solvent used depends on the layer of semiconductor material to be removed. For instance, when silicon oxide is to be removed, a diluted HF was found to be most efficient. The HF is diluted in water at a concentration of 49% HF and 51% water. The etch rate achieved by the diluted HF on silicon oxide is about 10,000 Å/min. at a uniformity of about 5% across the wafer surface. The abrasive particles utilized can be of any suitable type and of any suitable particle size. For example, one of the following particles may be suitably used: aluminum oxide, silicon carbide, silica sand and diamond-like-carbon particles. A suitable particle size is between about 0.01 $\mu$m and about 1 $\mu$m. The lower limit is controlled by the fact that when the particle size is too small, there is no abrasion effect on the oxide surface. The upper limit of the particle size is controlled such that the particles can flow through a dispensing nozzle without problems such as clogging the nozzle opening.

It has further been found that by raising the temperature of the solvent/abrasive particles mixture to above room temperature, the etching reaction or the oxide removal rate is more efficient or higher at the higher temperatures. A suitable temperature range can be between about 10° C. and about 80° C., preferably between about 10° C. and about 40° C. Various processing and material parameters that can be changed in order to control the removal process include the chemical composition of the mixture, the concentration of the abrasive particles, the rotational speed of the wafer and the temperature of the injected mixture. By utilizing a suitable combination, a planar oxide surface before photo masking and etching of a copper damascene process can be achieved.

The abrasive particles can be supplied in particle sizes between about 10 nm and about 90 nm (i.e. between about 100 Å and about 900 Å). The mixture should be injected onto the wafer surface at a flow rate between about 2 SCCM and about 10 SCCM. The flow rate can be suitably monitored in order to control the removal rate on the oxide surface.

The present invention novel method and apparatus for removing metal residues and dishing or erosion defect on an oxide layer from a semiconductor wafer have therefore been amply o described in the above description and in the appended drawings of FIGS. 4 and 5.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for planarizing an oxide surface and removing dishing or erosion defect comprising the steps of:

providing a process chamber equipped with a rotatable wafer platform, said process chamber is not equipped with a polishing head;

positioning a wafer on said platform with a surface to be planarized exposed, said surface having dishing or erosion defect thereon;

rotating said wafer at a rotational speed of at least 1000 RPM; and injecting a solvent/abrasive particles mixture onto said rotating surface for a sufficient length of time until said dishing or erosion defect is removed.

2. A method for planarizing an oxide surface and removing dishing or erosion defect according to claim 1 further comprising the step of rotating said wafer at a rotational speed between about 1000 RPM and about 10,000 RPM.

3. A method for planarizing an oxide surface and removing dishing or erosion defect according to claim 1 further comprising the step of removing metal residue of Cu or TaN from said surface of the wafer.

4. A method for planarizing an oxide surface and removing dishing or erosion defect according to claim 1 further comprising the step of mixing said solvent and abrasive particles together in a mixing head prior to injecting said solvent/abrasive particles onto said rotating surface of the wafer.

5. A method for planarizing an oxide surface and removing dishing or erosion defect according to claim 1, wherein said abrasive particles have been selected from the group consisting of aluminum oxide, silicon carbide, silica sand and diamond-like-carbon particles.

6. A method for planarizing an oxide surface and removing dishing or erosion defect according to claim 1, wherein said abrasive particles having a particle size between about 0.01 $\mu$m and about 1 $\mu$m.

7. A method for planarizing an oxide surface and removing dishing or erosion defect according to claim 1, wherein said solvent is a solvent for silicon oxide.

8. A method for planarizing an oxide surface and removing dishing or erosion defect according to claim 1, wherein said solvent is a solvent having high selectivity toward silicon nitride.

9. A method for planarizing an oxide surface and removing dishing or erosion defect according to claim 1, wherein said solvent is at least one member selected from the group consisting of HF, $H_3PO_4$, $HNO_3$, and $H_2SO_4$.

10. A method for planarizing an oxide surface and removing dishing or erosion defect according to claim 1, wherein said solvent is diluted HF and said abrasive particles are aluminum oxide.

11. A method for removing metal residues and dishing defect from an oxide surface of a semiconductor wafer comprising the steps of:

providing a semiconductor wafer having metal residues and dishing defect on a top surface;

rotating said semiconductor wafer to a rotational speed of at least 1000 RPM; and mixing abrasive particles in a solvent forming a mixture and injecting said mixture onto said rotating ton surface of the semiconductor wafer until said metal residues and dishing defect are substantially removed, said rotating top surface of the semiconductor wafer does not contact a polishing head during said injecting step.

12. A method for removing metal residues and dishing defect from an oxide surface of a semiconductor wafer according to claim 11, wherein said top surface is an oxide surface and said metal residues is Cu, Ta or TaN.

13. A method for removing metal residues and dishing defect from an oxide surface of a semiconductor wafer according to claim 11 further comprising the step of rotating said semiconductor wafer to a rotating speed between about 1000 RPM and about 10,000 RPM.

14. A method for removing metal residues and dishing defect from an oxide surface of a semiconductor wafer according to claim 11 further comprising the step of mixing abrasive particles of $Al_2O_3$ in a solvent of diluted HF.

15. A method for removing metal residues and dishing defect from an oxide surface of a semiconductor wafer according to claim 11, wherein said abrasive particles being selected from the group consisting of aluminum oxide, silicon carbide, silica sand and diamond-like carbon particles.

16. A method for removing metal residues and dishing defect from an oxide surface of a semiconductor wafer according to claim 11, wherein said solvent being selected from the group consisting of HF, $H_3PO_4$, $HNO_3$, and $H_2SO_4$.

* * * * *